(12) United States Patent
Yi et al.

(10) Patent No.: US 12,041,827 B2
(45) Date of Patent: Jul. 16, 2024

(54) STRETCHABLE DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Shijuan Yi, Wuhan (CN); Liang Sun, Wuhan (CN); Likun Cheng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 670 days.

(21) Appl. No.: 17/280,848

(22) PCT Filed: Nov. 26, 2020

(86) PCT No.: PCT/CN2020/131814
§ 371 (c)(1),
(2) Date: Mar. 26, 2021

(87) PCT Pub. No.: WO2022/082927
PCT Pub. Date: Apr. 28, 2022

(65) Prior Publication Data
US 2022/0359639 A1    Nov. 10, 2022

(30) Foreign Application Priority Data
Oct. 23, 2020   (CN) .......................... 202011146447.1

(51) Int. Cl.
*H10K 59/131*   (2023.01)
*H10K 77/10*    (2023.01)
*H10K 102/00*   (2023.01)

(52) U.S. Cl.
CPC ......... *H10K 59/131* (2023.02); *H10K 77/111* (2023.02); *H10K 2102/311* (2023.02)

(58) Field of Classification Search
CPC ...... H10K 59/131; H10K 59/12; H10K 59/17; H10K 59/179; H10K 77/111; H10K 2102/311; G09F 9/301; G09F 9/3023
See application file for complete search history.

(56) References Cited

U.S. PATENT DOCUMENTS

| | | | |
|---|---|---|---|
| 2010/0330338 A1 | 12/2010 | Boyce | |
| 2019/0237020 A1* | 8/2019 | Park | G09G 3/3266 |
| 2020/0312248 A1* | 10/2020 | Shin | G09G 3/3291 |

FOREIGN PATENT DOCUMENTS

| | | |
|---|---|---|
| CN | 107994052 A | 5/2018 |
| CN | 108461531 A | 8/2018 |

(Continued)

OTHER PUBLICATIONS

International Search Report in International application No. PCT/CN2020/131814, mailed on Jul. 21, 2021.

(Continued)

*Primary Examiner* — Erik Kielin
(74) *Attorney, Agent, or Firm* — PV IP PC; Wei Te Chung; Zhigang Ma

(57) ABSTRACT

A stretchable display panel includes a stretchable substrate, a plurality of display units, and a wiring portion. The stretchable substrate includes island-shaped areas and hinge areas. Each of the hinge area includes a first hinge area and a second hinge area. The wiring portion at least include a first power line and second power lines. A number of the second power lines disposed in the second hinge area is less than a number of the second power lines disposed in the first hinge area.

17 Claims, 9 Drawing Sheets

(56) References Cited

FOREIGN PATENT DOCUMENTS

| | | | |
|---|---|---|---|
| CN | 109064900 | A | 12/2018 |
| CN | 110364548 | A | 10/2019 |
| CN | 111146245 | A | 5/2020 |
| CN | 111244133 | A | 6/2020 |
| CN | 111276528 | A | 6/2020 |
| CN | 111326068 | A | 6/2020 |
| CN | 111354766 | A | 6/2020 |
| CN | 111383531 | A | 7/2020 |
| CN | 111755478 | A | 10/2020 |
| KR | 20200042140 | A | 4/2020 |

OTHER PUBLICATIONS

Written Opinion of the International Search Authority in International application No. PCT/CN2020/131814, mailed on Jul. 21, 2021.

Chinese Office Action issued in corresponding Chinese Patent Application No. 202011146447.1 dated Jul. 2, 2021, pp. 1-7.

\* cited by examiner

STRETCHABLE DISPLAY PANEL

RELATED APPLICATIONS

This application is a Notional Phase of PCT Patent Application No. PCT/CN2020/131814 having international filing date of Nov. 26, 2020, which claims the benefit of priority of Chinese Patent Application Nos. 202011146447.1 filed on Oct. 23, 2020. The contents of the above applications are all incorporated by reference as if fully set forth herein in their entirety.

FIELD OF DISCLOSURE

The present disclosure relates to the field of display technologies, and in particular to a stretchable display panel.

BACKGROUND

Stretchable display devices are an important technology for flexible display devices after appearance of foldable display devices. The stretchable display device can be deformed in any direction and can be stretched and restored. It can effectively solve existing technical problems of 4-sided curvature, non-gaussian surface fitting, and display area bending (active area bending), and has a wide range of application prospects. In current stretchable display panels (stretchable panels), in order to facilitate stretching and deformation, a substrate is arranged in an island shape. These substrate islands are connected by strip-shaped hinge areas (hinge), in which pixel circuits are arranged on the substrate islands, and signal lines between the pixel circuits are arranged on the strip-shaped hinge areas.

However, when the stretchable display panel stretches and deforms, the hinge areas will be deformed under force. A deformation resistance of the hinge areas is inversely proportional to its width. Currently, the hinge areas are usually formed with single-layer or multilayer metal lines. The metal lines of the same layer are disposed in parallel with each other, and a certain distance is reserved in the horizontal direction to prevent short circuits. Due to the excessive number of signal lines in the hinge areas, the hinge areas are formed too wide, which affects bending performance of the hinge areas.

As shown in FIG. 1A, which is a schematic diagram of signal lines in a pixel area of a stretchable display panel in the prior art. A first source/drain wiring layer in a first hinge area hg1 along a horizontal direction (i.e., a first type of signal line) includes a first scan line Sn, a second scan line Sn−1, and a light emitting control line EM. A second source/drain wiring layer in the first hinge area hg1 (i.e., a second type of signal line) includes a driving power line VDD and a common power source line VSS. The first source/drain wiring layer in a second hinge area hg2 along a vertical direction (i.e., the first type of signal line) includes a red sub-pixel data line dataR, a green sub-pixel data line dataG, and a blue sub-pixel data line dataB. The second source/drain wiring layer in the second hinge area hg2 (i.e., the second type of signal line) includes a driving power line VDD and a common power source line VSS. Therefore, in the second hinge area hg2, the wiring portions have 4 first type of signal lines and 2 second type of signal lines.

As shown in FIG. 1B, which is a schematic diagram of the driving power line VDD and the common power source line VSS disposed in the second hinge area of the stretchable display panel in the prior art. Both the driving power line VDD and the common power source line VSS pass through a pixel area AA. Horizontal signal lines (not shown in the figure) also include the first scan line Sn, the second scan line Sn−1, and the light emitting control line EM. Vertical signal lines (not shown in the figure) further include the initialization power line Vin, the red sub-pixel data line dataR, the green sub-pixel data line dataG, and the blue sub-pixel data line dataB.

In an embodiment of the prior art, a line width h1 of the first type of signal line is 3 um, a distance h1 between two adjacent first type of signal lines is 3 um, and a boundary distance between the first type of signal line located at the outermost edge and the hinge area is 5 um. Moreover, in order to ensure that widths of signal lines in an upper layer and a lower layer of the wiring portions are the same, a line width h2 of the second type of signal line in the second source/drain wiring layer of the wiring portions is 8 um, a distance h2 between two adjacent second type of signal lines is 5 um, and a boundary distance between the second type of signal line located at the outermost edge and the hinge areas 12 is 5 um. Therefore, a width H of the signal line in the second hinge area hg2 is 21 um, and a width of the second hinge area hg2 is 31 um.

Accordingly, in the prior art stretchable display panel, due to the excessive number of signal lines in the hinge areas, the hinge areas are formed too wide, which affects bending performance of the hinge areas, and further affects stretching performance of the stretchable display panel.

SUMMARY OF DISCLOSURE

In the prior art stretchable display panel, due to the excessive number of signal lines in the hinge areas, the hinge areas are formed too wide, which affects bending performance of the hinge areas, and further affects stretching performance of the stretchable display panel.

In a first aspect, an embodiment of the present disclosure provides a stretchable display panel, including a stretchable substrate, a plurality of display units, and a plurality of wiring portions. The stretchable substrate includes a plurality of island-shaped areas which are separated from each other and a plurality of hinge areas connecting the plurality of island-shaped areas. Each of the hinge areas includes a first hinge area extending in a first direction (D1) and a second hinge area extending in a second direction (D2). The plurality of display units are correspondingly disposed in the island-shaped areas. The plurality of wiring portions are connected to the plurality of display units and disposed in the hinge areas. Each of the wiring portions includes at least one first power line and second power lines, the first power line is arranged in the second hinge area, and the second power lines are arranged in the first hinge area and the second hinge area. Each of the wiring portions further includes scan lines and a data line, the scan lines are disposed in the first hinge area, the scan lines include a first scan line (Sn), a second scan line (Sn−1), and a light emitting control line (EM), and the first scan line (Sn), the second scan line (Sn−1), and the light emitting control line (EM) are arranged parallel to each other along the first direction (D1). The data line is disposed in the second hinge area, the data line includes one of a red sub-pixel data line (dataR), a green sub-pixel data line (dataG), and a blue sub-pixel data line (dataB), and the red sub-pixel data line (dataR), the green sub-pixel data line (dataG), and the blue sub-pixel data line (dataB) are arranged parallel to each other along the second direction (D2).

A number of the second power lines disposed in the second hinge area is less than a number of the second power lines disposed in the first hinge area.

In the stretchable display panel of the embodiment of the present disclosure, the first power line includes an initialization power line (Vin), the second power lines include a driving power line (VDD) and a common power source line (VSS), and both the driving power line (VDD) and the common power source line (VSS) are formed with a metal grid pattern.

In the stretchable display panel of the embodiment of the present disclosure, the metal grid pattern include a first branch line arranged along the first direction (D1) and a second branch line arranged along the second direction (D2), and two adjacent first branch lines are arranged parallel to each other; a plurality of second branch arrays are also electrically connected between the two adjacent first branch lines, each of the second branch arrays includes a pair of second branch lines arranged in parallel with each other, the second branch arrays are arranged in columns along the second direction (D2) at intervals, and the interval is in a unit of one second branch array, and the second branch arrays of two adjacent columns are staggered along the second direction (D2) and are arranged at the interval in the unit of one second branch array.

In the stretchable display panel of the embodiment of the present disclosure, the second branch arrays in the metal grid pattern formed by the driving power line (VDD) and the second branch arrays in the metal grid pattern formed by the common power source line (VSS) are staggered along the second direction (D2).

In the stretchable display panel of the embodiment of the present disclosure, each of the display unit include a plurality of thin film transistors, a storage capacitor, and an organic light emitting diode.

In the stretchable display panel of the embodiment of the present disclosure, each of the display units further includes a buffer layer, an active layer, a first gate insulating layer, a first gate metal layer, a second gate insulating layer, a second gate metal layer, an interlayer insulating layer, a first organic filling layer, a first source/drain wiring layer, a first planarization layer, a second source/drain wiring layer, a second planarization layer, an anode metal layer, and a pixel definition layer which are sequentially disposed on the stretchable substrate.

In the stretchable display panel of the embodiment of the present disclosure, the second source/drain wiring layer in the first hinge area includes the driving power line (VDD) and the common power source line (VSS); the second source/drain wiring layer in the second hinge area includes the driving power line (VDD) and the initialization power line (Vin) along a third direction (D3), and the second source/drain wiring layer in the second hinge area includes the common power source line (VSS) and the initialization power line (Vin) along the second direction (D2); and the third direction (D3) is opposite to the second direction (D2).

In the stretchable display panel of the embodiment of the present disclosure, the first source/drain wiring layer in the first hinge area includes the first scan line (Sn), the second scan line (Sn−1), and the light emitting control line (EM); and the first source/drain wiring layer in the second hinge area includes the red sub-pixel data line (dataR), the green sub-pixel data line (dataG), and the blue sub-pixel data line (dataB).

In the stretchable display panel of the embodiment of the present disclosure, a line width of a first type of signal line of the wiring portion in the first source/drain wiring layer ranges from 2 μm to 4 μm, a distance between two adjacent first type of signal lines ranges from 2 μm to 4 μm, and a boundary distance between the first type of signal line located at an outermost edge and the hinge area ranges from 4 μm to 6 μm; a line width of a second type of signal line of the wiring portion in the second source/drain wiring layer ranges from 4 μm to 6 μm, a distance between two adjacent second type of signal lines ranges from 4 μm to 6 μm, and a boundary distance between the second type of signal line located at an outermost edge and the hinge area ranges from 4 μm to 6 μm.

In the stretchable display panel of the embodiment of the present disclosure, the first source/drain wiring layer and the second source/drain wiring layer are made of Ti/Al/Ti alloy with a single layer or multiple layers.

In a second aspect, an embodiment of the present disclosure further provides a stretchable display panel, including a stretchable substrate, a plurality of display units, and a plurality of wiring portions. The stretchable substrate includes a plurality of island-shaped areas which are separated from each other and a plurality of hinge areas connecting the plurality of island-shaped areas. Each of the hinge areas includes a first hinge area extending in a first direction (D1) and a second hinge area extending in a second direction (D2). The plurality of display units are correspondingly disposed in the island-shaped areas. The plurality of wiring portions are connected to the plurality of display units and disposed in the hinge areas. Each of the wiring portions includes at least one first power line and second power lines, the first power line is arranged in the second hinge area, and the second power lines are arranged in the first hinge area and the second hinge area.

A number of the second power lines disposed in the second hinge area is less than a number of the second power lines disposed in the first hinge area.

In the stretchable display panel of the embodiment of the present disclosure, the first power line includes an initialization power line (Vin), the second power lines include a driving power line (VDD) and a common power source line (VSS), and both the driving power line (VDD) and the common power source line (VSS) are formed with a metal grid pattern.

In the stretchable display panel of the embodiment of the present disclosure, the metal grid pattern include a first branch line arranged along the first direction (D1) and a second branch line arranged along the second direction (D2), and two adjacent first branch lines are arranged parallel to each other; a plurality of second branch arrays are also electrically connected between the two adjacent first branch lines, each of the second branch arrays includes a pair of second branch lines arranged in parallel with each other, the second branch arrays are arranged in columns along the second direction (D2) at intervals, and the interval is in a unit of one second branch array, and the second branch arrays of two adjacent columns are staggered along the second direction (D2) and are arranged at the interval in the unit of one second branch array.

In the stretchable display panel of the embodiment of the present disclosure, the second branch arrays in the metal grid pattern formed by the driving power line (VDD) and the second branch arrays in the metal grid pattern formed by the common power source line (VSS) are staggered along the second direction (D2).

In the stretchable display panel of the embodiment of the present disclosure, each of the display unit include a plurality of thin film transistors, a storage capacitor, and an organic light emitting diode.

In the stretchable display panel of the embodiment of the present disclosure, each of the display units further includes a buffer layer, an active layer, a first gate insulating layer, a first gate metal layer, a second gate insulating layer, a second gate metal layer, an interlayer insulating layer, a first organic filling layer, a first source/drain wiring layer, a first planarization layer, a second source/drain wiring layer, a second planarization layer, an anode metal layer, and a pixel definition layer which are sequentially disposed on the stretchable substrate.

In the stretchable display panel of the embodiment of the present disclosure, the second source/drain wiring layer in the first hinge area includes the driving power line (VDD) and the common power source line (VSS); the second source/drain wiring layer in the second hinge area includes the driving power line (VDD) and the initialization power line (Vin) along a third direction (D3), and the second source/drain wiring layer in the second hinge area includes the common power source line (VSS) and the initialization power line (Vin) along the second direction (D2); and the third direction (D3) is opposite to the second direction (D2).

In the stretchable display panel of the embodiment of the present disclosure, a line width of a first type of signal line of the wiring portion in the first source/drain wiring layer ranges from 2 μm to 4 μm, a distance between two adjacent first type of signal lines ranges from 2 μm to 4 μm, and a boundary distance between the first type of signal line located at an outermost edge and the hinge area ranges from 4 μm to 6 μm; a line width of a second type of signal line of the wiring portion in the second source/drain wiring layer ranges from 4 μm to 6 μm, a distance between two adjacent second type of signal lines ranges from 4 μm to 6 μm, and a boundary distance between the second type of signal line located at an outermost edge and the hinge area ranges from 4 μm to 6 μm.

In the stretchable display panel of the embodiment of the present disclosure, the first source/drain wiring layer and the second source/drain wiring layer are made of Ti/Al/Ti alloy with a single layer or multiple layers.

In comparison with the prior art, the stretchable display panel of the embodiments of the present disclosure makes the number of second power lines in the hinge areas extending along the second direction less than that of the second power lines in the hinge areas extending along the first direction. This effectively reduces the number of lines and line width of the hinge areas, and further increases stretchable performance of the display panel. Moreover, it ensures that a voltage drop in the display panel is reduced, and further makes the stretchable display panel to display uniform.

DETAILED DESCRIPTION

Embodiments of the present disclosure are directed to an existing stretchable display panel. Due to the excessive number of signal lines in hinge areas, the hinge areas are formed too wide, which affects bending performance of the hinge areas, and further affects stretching performance of the stretchable display panel. These embodiments can solve these defects.

Figure 2:
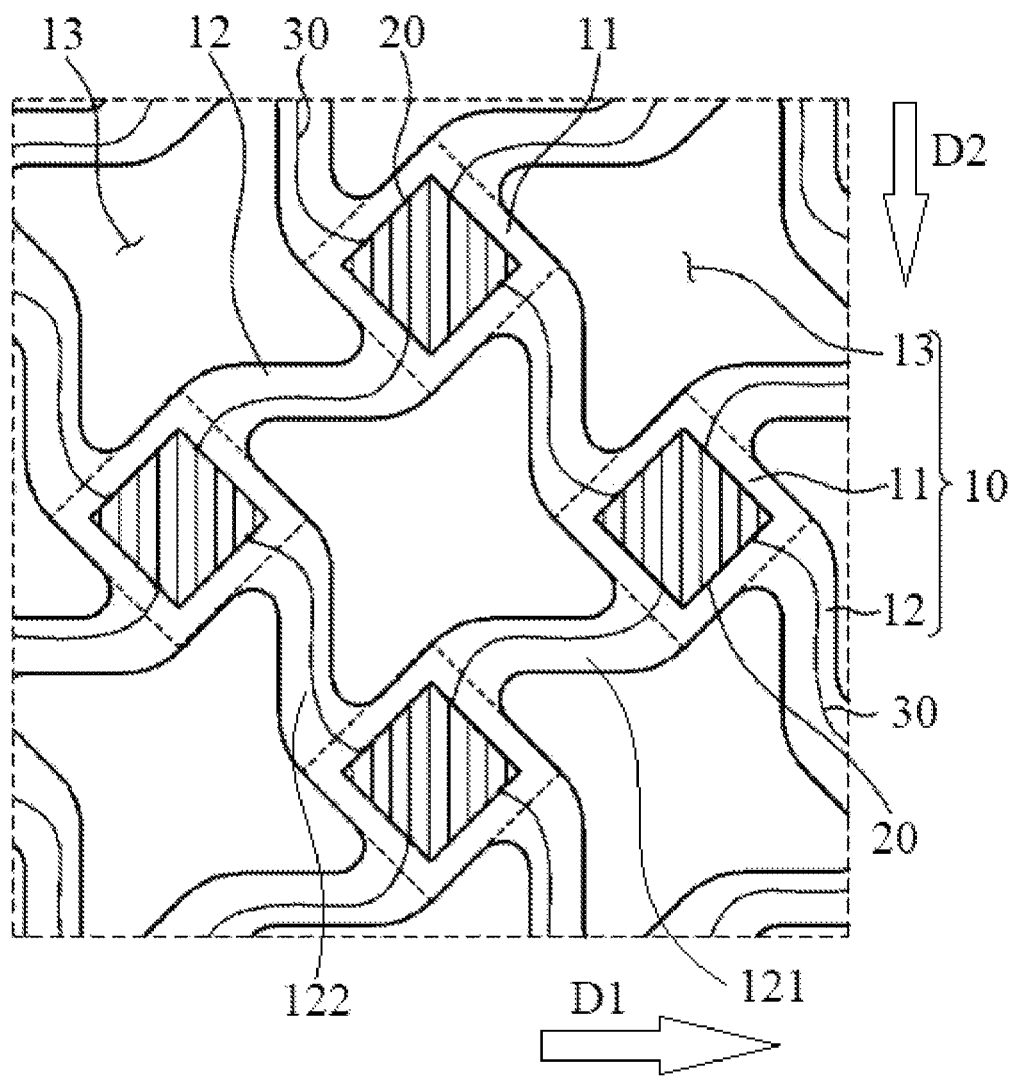
FIG. 2 is a top plan view of a part of a stretchable display panel of an embodiment of the present disclosure.

As shown in FIG. 2, which is a top plan view of a part of a stretchable display panel of an embodiment of the present disclosure. According to the exemplary embodiment, the stretchable display panel may include a stretchable substrate 10, display units 20, and wiring portions 30.

Specifically, the stretchable substrate 10 may include polymers, such as polyimide, polyethylene, polypropylene, etc. The stretchable substrate 10 also includes island-shaped areas 11, hinge areas 12, and penetrating areas 13.

The stretchable substrate 10 may include a plurality of the island-shaped areas 11. The plurality of the island-shaped areas 11 may be separated from each other. Each of the island-shaped areas 11 may have various planar shapes, such as triangles, pentagons, hexagons, polygons, circles, ellipses, and closed loops. For example, each of the island-shaped areas 11 may have a flat square shape.

One of the hinge areas 12 may be connected to two adjacent island-shaped areas 11 of the plurality of island-shaped areas 11. The hinge areas 12 may be formed integrally with the island-shaped areas 11, and each of the hinge areas 12 may extend from one island-shaped area 11 to another island-shaped area 11. The hinge areas 12 may have a bent shape that is curved in a plan view, for example.

Furthermore, each of the hinge areas 12 includes a first hinge area 121 extending along a first direction D1 and a second hinge area 122 extending along a second direction D2.

Specifically, the penetrating area 13 may be surrounded by the island-shaped areas 11 and the hinge areas 12. The penetrating area 13 may be, for example, a recessed or penetrated portion of the stretchable substrate 10.

Specifically, the display units 20 can display images. Each of the display units 20 may include a pixel as the smallest unit for displaying an image, and a plurality of display units 20 may be arranged. Each of the plurality of display units 20 may be arranged in the corresponding island-shaped area 11 of the plurality of island-shaped areas 11.

Specifically, the wiring portions 30 may be connected between the plurality of display units 30. The wiring portions 30 may be arranged in the hinge areas 12, and each of the wiring portions 30 may extend from one island-shaped area 11 to another island-shaped area 11 through the hinge area 12.

Preferably, the wiring portions 30 may extend along the hinge areas 12 in a linear shape or a curved shape.

Figure 3:
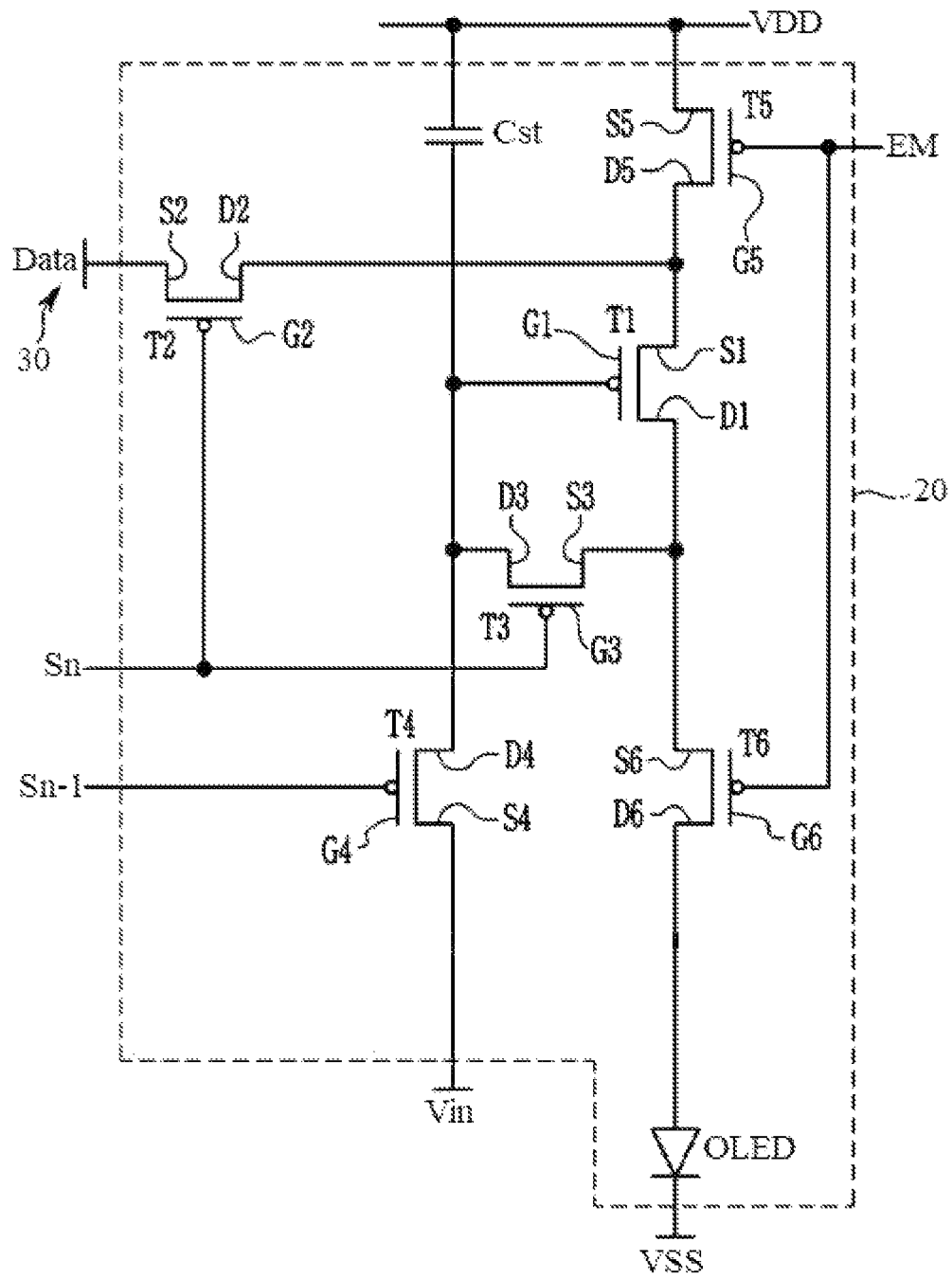
FIG. 3 is a circuit diagram of a display unit of FIG. 2.

As shown in FIG. 3, which is a circuit diagram of a display unit of FIG. 2.

The display units 20 may include a plurality of thin film transistors (T1, T2, T3, T4, T5, and T6), a storage capacitor Cst, and an organic light emitting diode (OLED), which are connected to the wiring portions 30. Each of the wiring portions 30 includes first power lines and second power lines. The first power lines include an initialization power line Vin. The second power lines include a driving power line VDD and a common power source line VSS. Each of the wiring portions 30 also include scan lines and a data line Data. The scan lines are disposed in the first hinge area 121. The scan lines include a first scan line Sn, a second scan line Sn−1, and a light emitting control line EM. The data line Data is disposed in the second hinge area 122. The data line Data includes one of a red sub-pixel data line dataR, a green sub-pixel data line dataG, and a blue sub-pixel data line dataB.

Specifically, the plurality of thin film transistors may include a first thin film transistor T1, a second thin film transistor T2, a third thin film transistor T3, a fourth thin film transistor T4, a fifth thin film transistor T5, and a sixth thin film transistor T6.

Specifically, a first gate G1 of the first thin film transistor T1 may be connected to a third drain D3 of the third thin film transistor T3 and a fourth drain D4 of the fourth thin film transistor T4, respectively. A first source S1 of the first thin film transistor T1 may be respectively connected to a second drain D2 of the second thin film transistor T2 and a fifth drain D5 of the fifth thin film transistor T5. A first drain D1 of the first thin film transistor T1 may be connected to a third source S3 of the third thin film transistor T3 and a sixth source S6 of the sixth thin film transistor T6, respectively.

A second gate G2 of the second thin film transistor T2 may be connected to the first scan line Sn. A second source S2 of the second thin film transistor T2 may be connected to the data line Data. The second drain D2 of the second thin film transistor T2 may be connected to the first source S1 of the first thin film transistor T1.

A third gate G3 of the third thin film transistor T3 may be connected to the first scan line Sn. The third source S3 of the third thin film transistor T3 may be connected to the first drain D1 of the first thin film transistor T1. The third drain D3 of the third thin film transistor T3 may be connected to the first gate G1 of the first thin film transistor T1.

A fourth gate G4 of the fourth thin film transistor T4 may be connected to the second scan line Sn−1. A fourth source S4 of the fourth thin film transistor T4 may be connected to the initialization power line Vin. The fourth drain D4 of the fourth thin film transistor T4 may be connected to the first gate G1 of the first thin film transistor T1.

A fifth gate G5 of the fifth thin film transistor T5 may be connected to the light emitting control line EM. A fifth source S5 of the fifth thin film transistor T5 may be connected to the driving power line VDD. The fifth drain D5 of the fifth thin film transistor T5 may be connected to the first source S1 of the first thin film transistor T1.

A sixth gate G6 of the sixth thin film transistor T6 may be connected to the light emitting control line EM. The sixth source S6 of the sixth thin film transistor T6 may be connected to the first drain D1 of the first thin film transistor T1. The sixth drain D6 of the sixth thin film transistor T6 may be connected to the organic light emitting element OLED.

Each of the wiring portions 30 may include the first scan line Sn, the second scan line Sn−1, the light emitting control line EM, the data line Data, the driving power line VDD, and the initialization power line Vin. The first scan line Sn transmits a first scan signal to the second gate G2 of the second thin film transistor T2 and the third gate G3 of the third thin film transistor T3. The second scan line Sn−1 transmits a second scan signal to the fourth gate G4 of the fourth thin film transistor T4. The light emitting control line EM transmits a light emission control signal to the fifth gate G5 of the fifth thin film transistor T5 and the sixth gate G6 of the sixth thin film transistor T6. The data line Data transmits a data signal to the second source S2 of the second thin film transistor T2. The driving power line VDD transmits driving power to one electrode of the storage capacitor Cst and the fifth source S5 of the fifth thin film transistor T5. The initialization power line Vin transmits an initialization signal to the fourth source S4 of the fourth thin film transistor T4.

The storage capacitor Cst may include one electrode connected to the driving power line VDD and another electrode connected to the first gate G1 of the first thin film transistor T1 and the third drain D3 of the third thin film transistor T3.

The organic light emitting element OLED may include a first electrode, a second electrode on the first electrode, and an organic emission layer disposed between the second electrode and the first electrode. The first electrode of the organic light emitting element OLED may be connected to the sixth drain D6 of the sixth thin film transistor T6. The second electrode of the organic light emitting element OLED may be connected to the common power source line VSS supplied with a common power source.

In some embodiments, each of the display units may include the plurality of thin film transistors, the storage capacitor Cst, and the organic light emitting element OLED. The plurality of thin film transistors include the first thin film transistor T1 to a seventh thin film transistor T6. In some embodiments, the display units 20 may include at least two thin film transistors, at least one storage capacitor, and an organic light emitting element.

Figure 4:
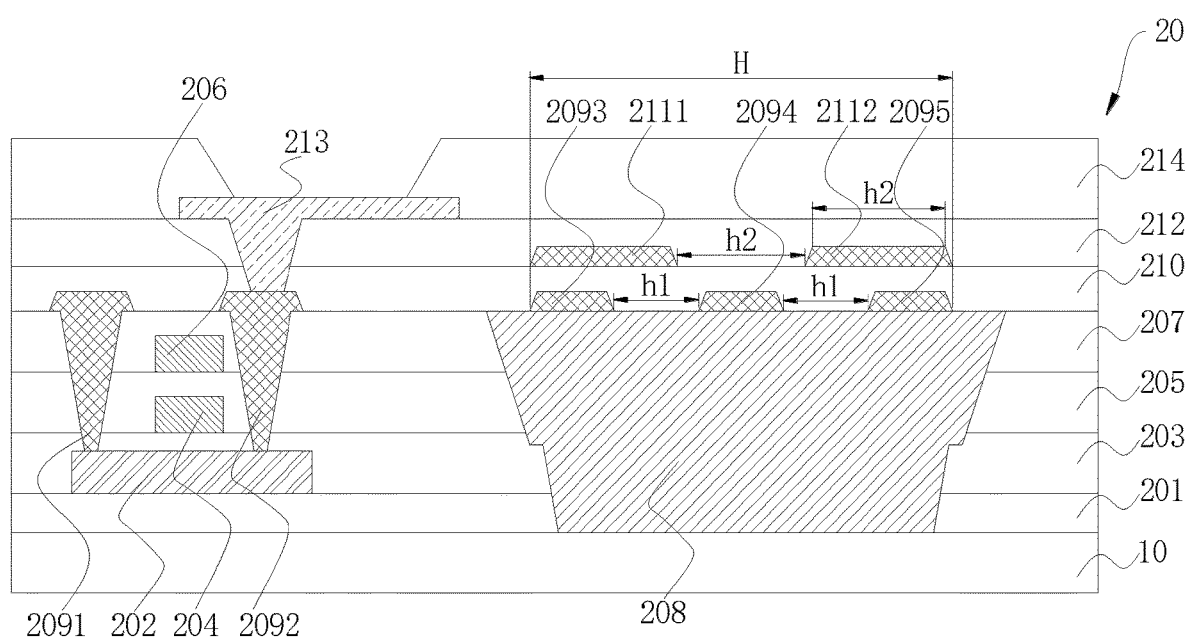
FIG. 4 is a cross-sectional view of a stretchable display panel of an embodiment of the present disclosure.

As shown in FIG. 4, which is a cross-sectional view of a stretchable display panel of an embodiment of the present disclosure. The stretchable display panel includes display units 20, and the display units 20 include thin film transistors arranged on the stretchable substrate and organic light emitting elements connected to the thin film transistors.

Specifically, each of the display unit 20 includes a buffer layer 201, an active layer 202, a first gate insulating layer 203, a first gate metal layer 204, a second gate insulating layer 205, a second gate metal layer 206, an interlayer insulating layer 207, a first organic filling layer 208, a first source/drain wiring layer, a first planarization layer 210, a second source/drain wiring layer, a second planarization layer 212, an anode metal layer 213, and a pixel definition layer 214 which are sequentially disposed on the stretchable substrate 10.

The first source/drain wiring layer includes a source 2091, a drain 2092, a first first type of signal line 2093, a second first type of signal line 2094, and a third first type of signal line 2095. The source 2091 and the drain 2092 are electrically connected to the active layer 202 through first via holes, respectively. The anode metal layer 213 is electrically connected to the active layer 202 through the drain 2092. The second source/drain wiring layer includes a first second type of signal line 2111 and a second second type of signal line 2112. The first organic filling layer 208 is configured to reduce bending stress, and a purpose of bending is to achieve a narrow board design.

Specifically, the first source/drain wiring layer and the second source/drain wiring layer are made of Ti/Al/Ti alloy with a single layer or multiple layers.

Specifically, a line width of the first type of signal line of the wiring portion 30 in the first source/drain wiring layer ranges from 2 μm to 4 μm. A distance between two adjacent first type of signal lines ranges from 2 μm to 4 μm. A boundary distance between the first type of signal line located at the outermost edge and the hinge area 12 ranges from 4 μm to 6 μm. A line width of a second type of signal line of the wiring portion 30 in the second source/drain wiring layer ranges from 4 μm to 6 μm. A distance between two adjacent second type of signal lines ranges from 4 μm to 6 μm. A boundary distance between the second type of signal line located at the outermost edge and the hinge area 12 ranges from 4 μm to 6 μm.

Preferably, a line width h1 of the first type of signal line is 3 μm a distance h1 between two adjacent first type of signal lines is 3 μm, and a boundary distance between the first type of signal line located at the outermost edge and the hinge area 12 is 5 μm. Moreover, a line width h2 of the second type of signal line in the second source/drain wiring layer of the wiring portion 30 is 5 μm, a distance h2 between two adjacent second type of signal lines is 5 μm, and a boundary distance between the second type of signal line located at the outermost edge and the hinge areas 12 is 5 μm.

Figure 5A:
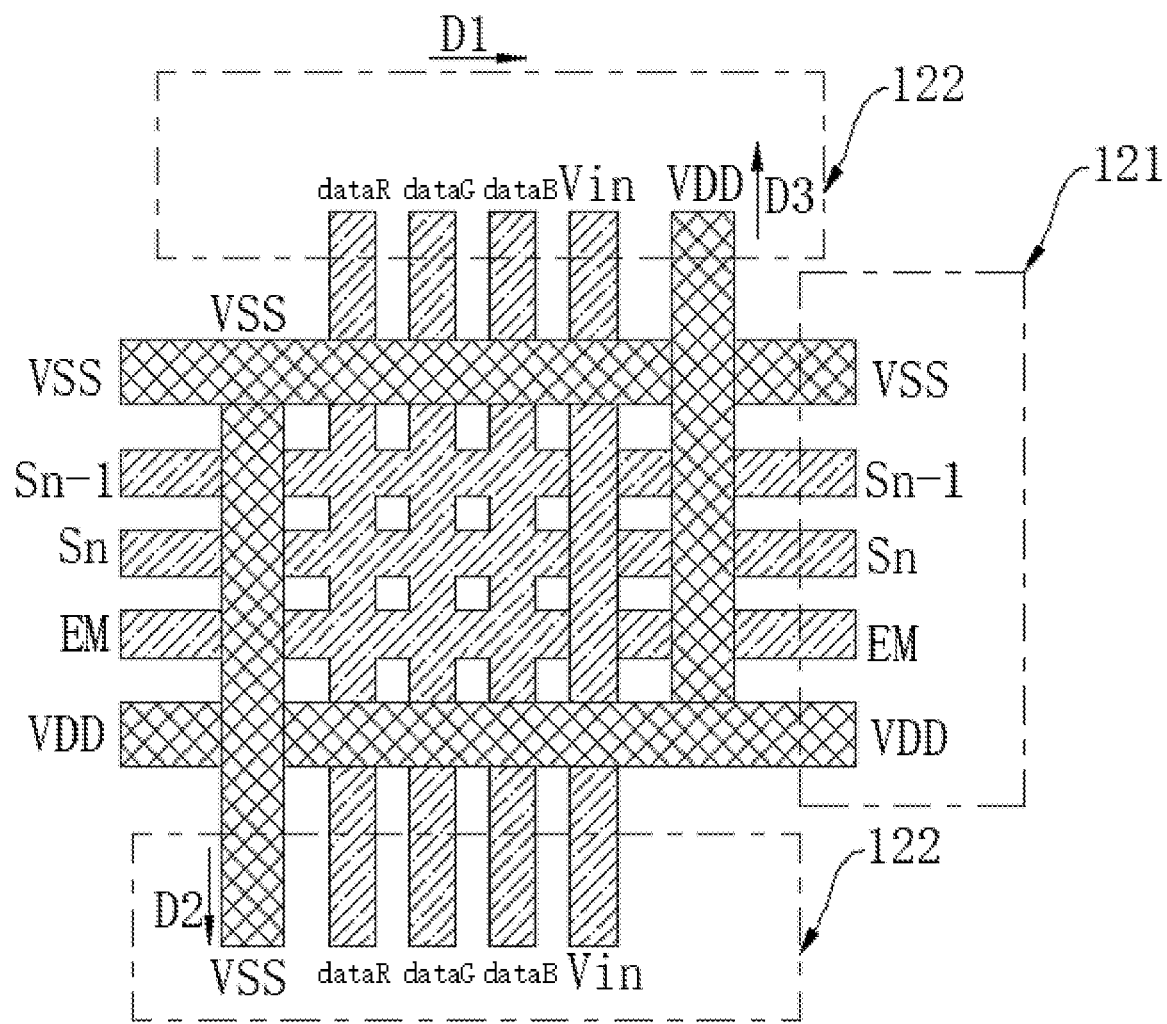
FIG. 5A is a schematic diagram of signal lines in a pixel area of a stretchable display panel of an embodiment of the present disclosure.

As shown in FIG. 5A, which is a schematic diagram of signal lines in a pixel area of a stretchable display panel of an embodiment of the present disclosure. The wiring portion 30 at least includes a first power line and second power lines, the first power line is arranged in the second hinge area 122, and the second power lines are completely arranged in the hinge area 12.

Furthermore, a number of the second power lines disposed in the second hinge area 122 is less than a number of the second power lines disposed in the first hinge area 121.

Specifically, the first power line includes the initialization power line Vin. The second power lines include the driving power line VDD and the common power source line VSS, and the driving power line VDD and the common power source line VSS are arranged parallel to each other in the first hinge area 121 or the second hinge area 122.

Furthermore, both the driving power line VDD and the common power source line VSS are formed with a new type of metal grid pattern. The second source/drain wiring layer in the first hinge area 121 includes the driving power line VDD and the common power source line VSS. The second source/drain wiring layer in the second hinge area 122 includes the driving power line VDD and the initialization power line Vin along a third direction D3, and the second source/drain wiring layer in the second hinge area 122 includes the common power source line VSS and the initialization power line Vin along the second direction D2. The third direction D3 is opposite to the second direction D2.

Specifically, the first source/drain wiring layer in the first hinge area 121 (i.e., the first type of signal line) includes the first scan line Sn, the second scan line Sn−1, and the light emitting control line EM. The second source/drain wiring layer in the first hinge area 121 (i.e., the second type of signal line) includes the driving power line VDD and the common power source line VSS.

Therefore, in the first hinge area 121, the wiring portion 30 includes three of the first type of signal lines and two of the second type of signal lines.

Preferably, the line width h1 of the first type of signal line is 3 um. The distance h1 between two adjacent first type of signal lines is 3 um. The boundary distance between the first type of signal line located at the outermost edge and the hinge area 12 is 5 um.

Furthermore, in order to ensure that widths of signal lines in an upper layer and a lower layer of the wiring portion are the same, the line width h2 of the second type of signal line in the second source/drain wiring layer of the wiring portion 30 is 5 um, the distance h2 between two adjacent second type of signal lines is 5 um, and the boundary distance between the second type of signal line located at the outermost edge and the hinge areas 12 is 5 um.

Therefore, a width H of the signal line in the first hinge area 121 is 15 um, and a width of the first hinge area 121 is 25 um.

Specifically, the first source/drain wiring layer in the second hinge area 122 (i.e., the first type of signal line) includes the red sub-pixel data line dataR, the green sub-pixel data line dataG, and the blue sub-pixel data line dataB. The second source/drain wiring layer in the second hinge area 122 (i.e., the second type of signal line) includes the initialization power line Vin, the driving power line VDD, and the common power source line VSS.

The second source/drain wiring layer in the second hinge area 122 includes the driving power line VDD and the initialization power line Vin along the third direction D3, and the second source/drain wiring layer in the second hinge area 122 includes the common power source line VSS and the initialization power line Vin along the second direction D2.

Since the driving power line VDD and the common power source line VSS extend in opposite directions to each other, in the second hinge area 122, the wiring portion 30 includes three of the first type of signal lines and two of the second type of signal lines. In a first case, the driving power line VDD and the initialization power line Vin extend along the third direction D3. In a second case, the common power source line VSS and the initialization power line Vin extend along the second direction D2.

Preferably, the line width h1 of the first type of signal line is 3 um, the distance h1 between two adjacent first type of signal lines is 3 um, and the boundary distance between the first type of signal line located at the outermost edge and the hinge area 12 is 5 um.

Furthermore, in order to ensure that widths of signal lines in an upper layer and a lower layer of the wiring portion are the same, the line width h2 of the second type of signal line in the second source/drain wiring layer of the wiring portion 30 is 5 um, the distance h2 between two adjacent second type of signal lines is 5 um, and the boundary distance between the second type of signal line located at the outermost edge and the hinge areas 12 is 5 um.

Therefore, a width H of the signal line in the second hinge area 121 is 15 um, and a width of the first hinge area 122 is 25 um.

Figure 1A:
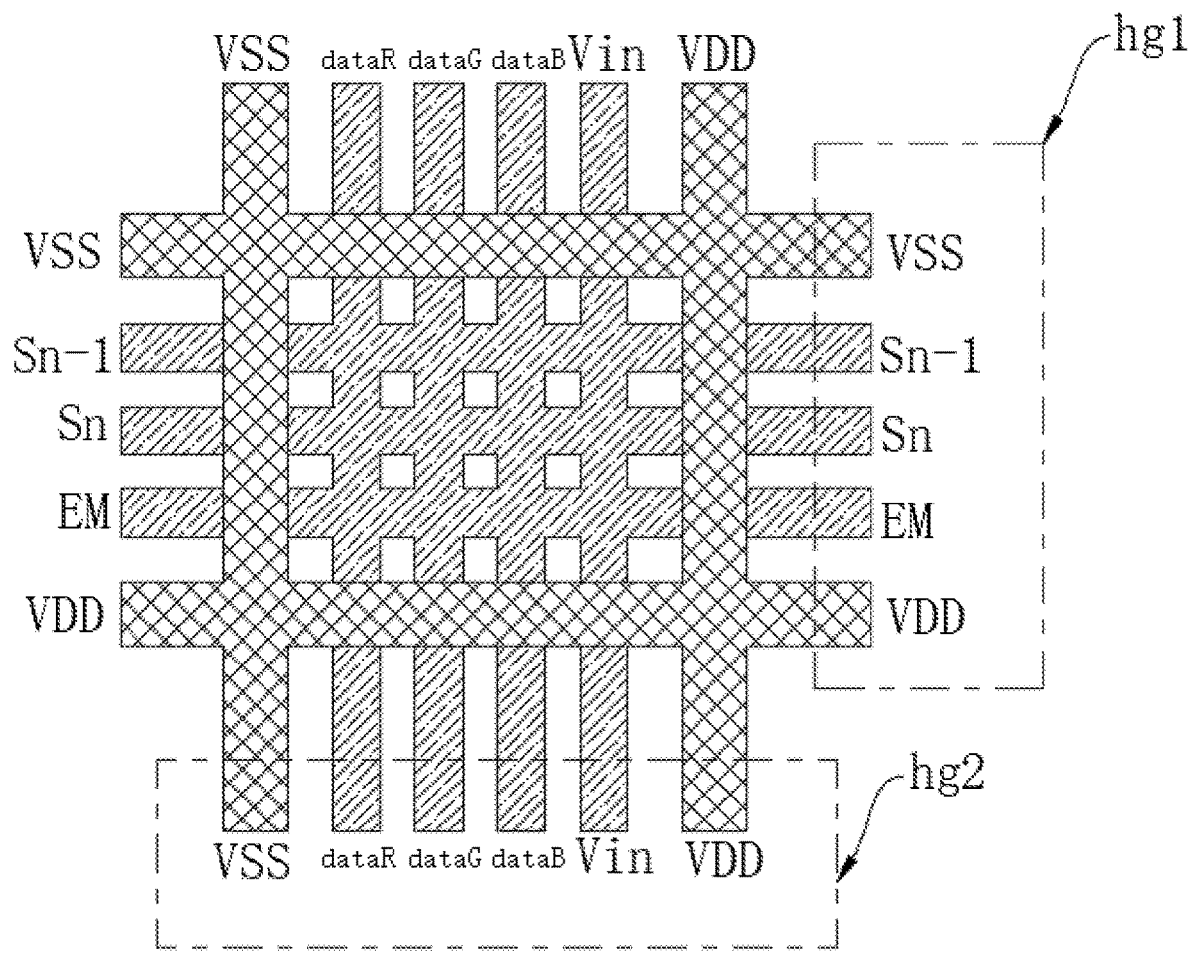
FIG. 1A is a schematic diagram of signal lines in a pixel area of a stretchable display panel in the prior art.
Figure 1B:
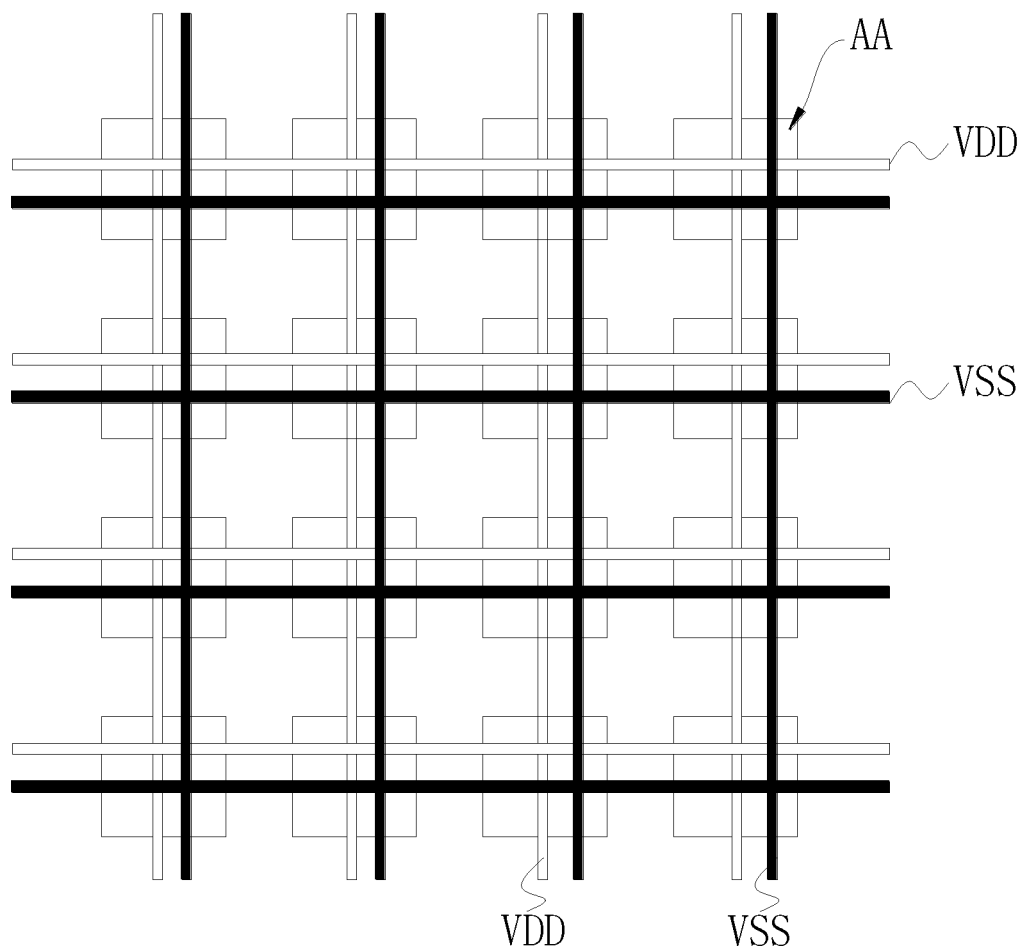
FIG. 1B is a schematic diagram of a driving power line VDD and a common power source line VSS disposed in a second hinge area of the stretchable display panel in the prior art.

In comparison FIG. 5A with FIG. 1A, it can be seen that the number (5) and the width (15 um) of the signal lines of the second hinge area 122 in FIG. 5A are less than the number (6) and the width (21 um) of signal lines of the second hinge area 122 in FIG. 1A. In comparison to prior art, the embodiments of the present disclosure increase the stretchable performance of the display panel. Also, it ensures that a voltage drop in the display panel is reduced, and further makes the stretchable display panel to display uniform.

Figure 5B:
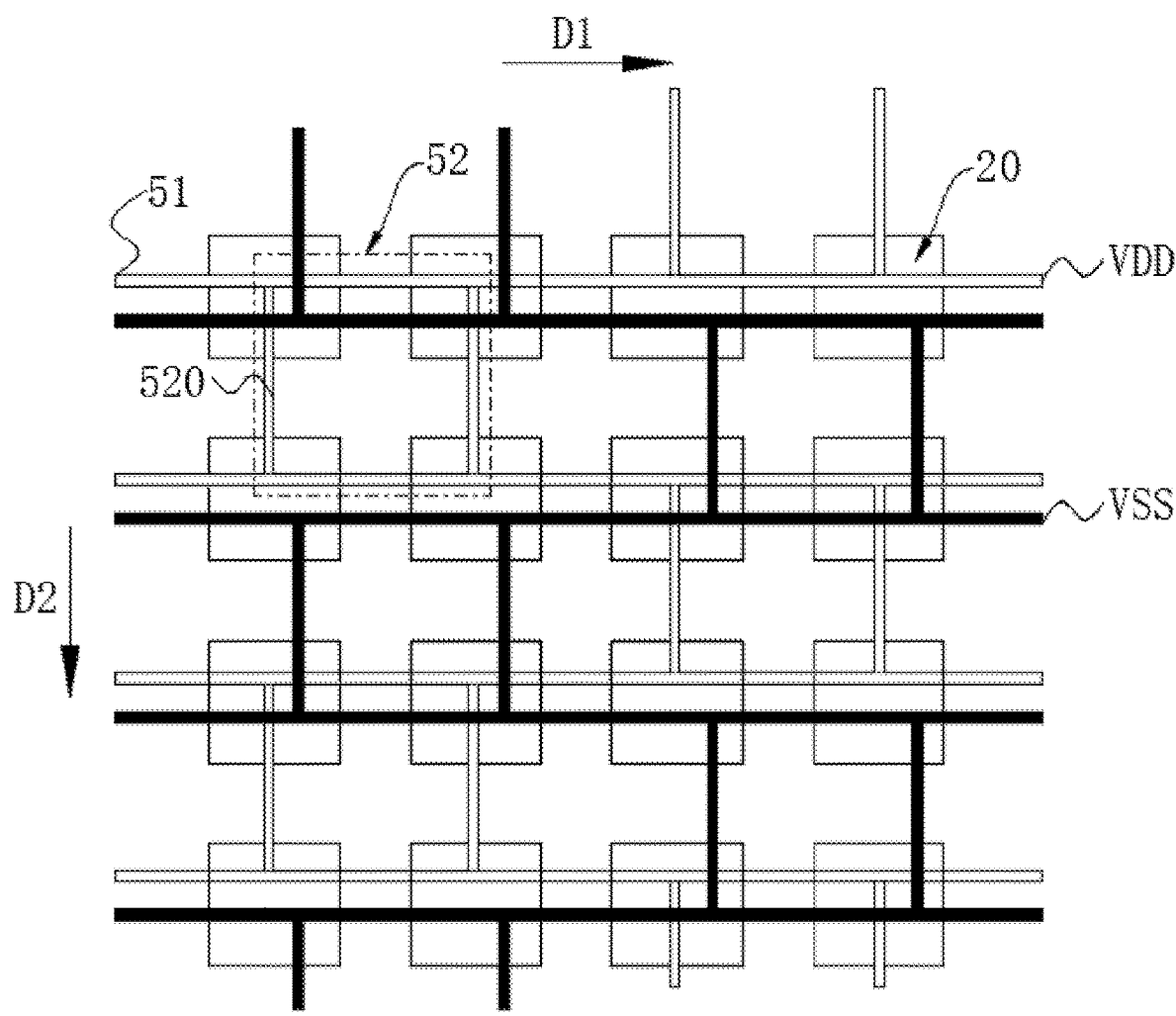
FIG. 5B is a schematic diagram of a driving power line VDD and a common power line VSS in a second hinge area of a stretchable display panel of an embodiment of the present disclosure.

As shown in FIG. 5B, which is a schematic diagram of a driving power line VDD and a common power line VSS in a second hinge area of a stretchable display panel of an embodiment of the present disclosure. The horizontal signal lines (not shown in the figure) also include the first scan line Sn, the second scan line Sn−1, and the light emitting control line EM. The longitudinal signal lines (not shown in the figure) also include the initialization power line Vin, the red sub-pixel data line dataR, the green sub-pixel data line dataG, and the blue sub-pixel data line dataB.

Both the driving power line VDD and the common power source line VSS are formed with a metal grid pattern.

Specifically, the metal grid pattern include a first branch line 51 arranged along the first direction D1 and a second branch line 520 arranged along the second direction D2, and two adjacent first branch lines 51 are arranged parallel to each other. A plurality of second branch arrays 52 are also electrically connected between the two adjacent first branch lines 51, each of the second branch arrays 52 includes a pair of second branch lines 520 arranged in parallel with each other. The second branch arrays 52 are arranged in columns along the second direction D2 at intervals, and the interval is in a unit of one second branch array 52, and the second branch arrays 52 of two adjacent columns are staggered along the second direction D2 and are arranged at the interval in the unit of one second branch array 52.

Furthermore, the second branch arrays in the metal grid pattern formed by the driving power line VDD and the second branch arrays in the metal grid pattern formed by the common power source line VSS are staggered along the second direction D2.

Figure 6:
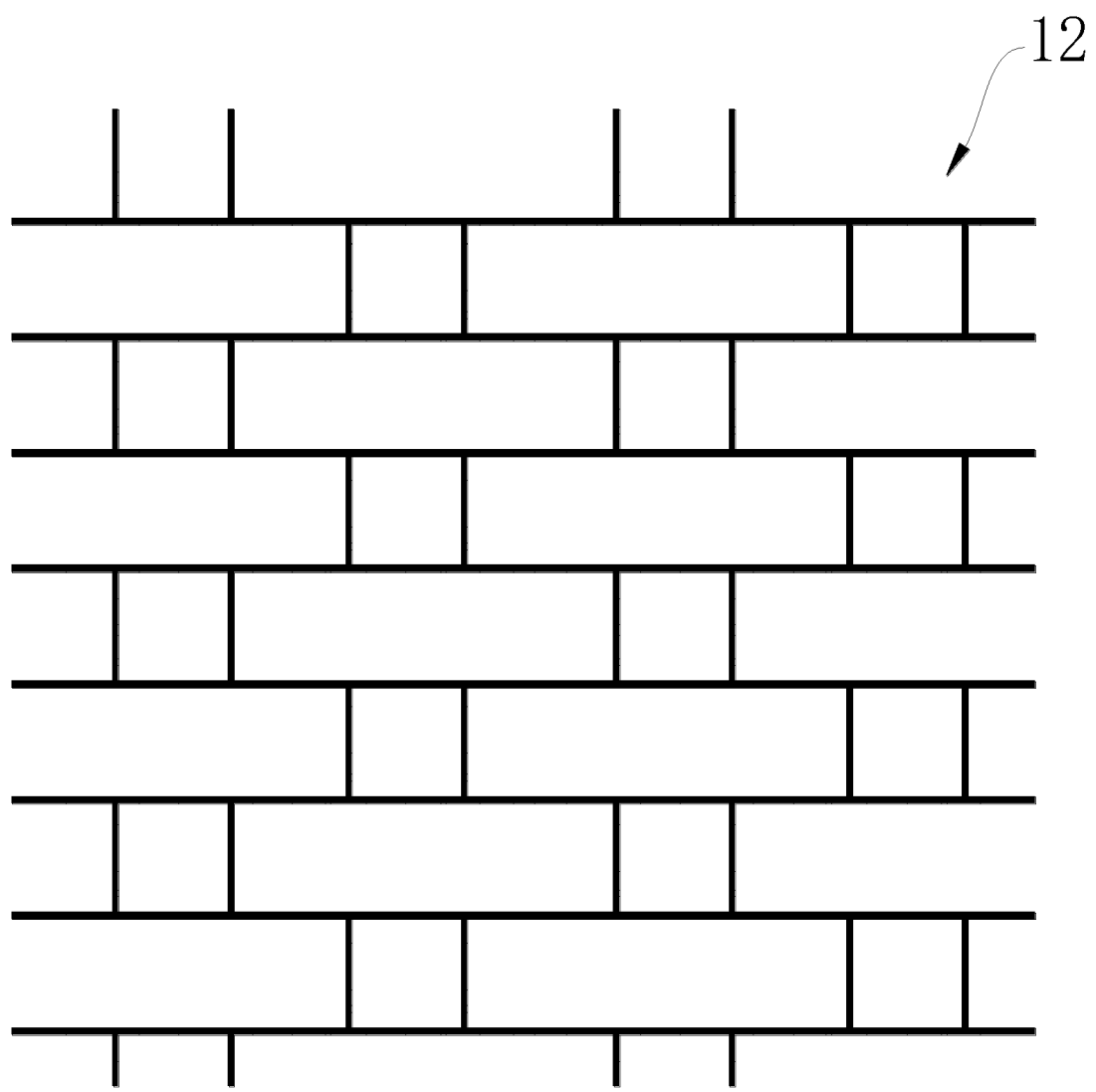
FIG. 6 is a schematic diagram of a metal grid pattern formed by a driving power line or a common power source line in hinge areas of a stretchable display panel of an embodiment of the present disclosure.

As shown in FIG. 6, which is a schematic diagram of a metal grid pattern formed by a driving power line VDD or a common power source line VSS in hinge areas of a stretchable display panel of an embodiment of the present disclosure. It can be seen from FIG. 6 that the driving power line VDD and the common power source line VSS form with the same type of the metal grid pattern in the hinge areas 12.

Figure 7:
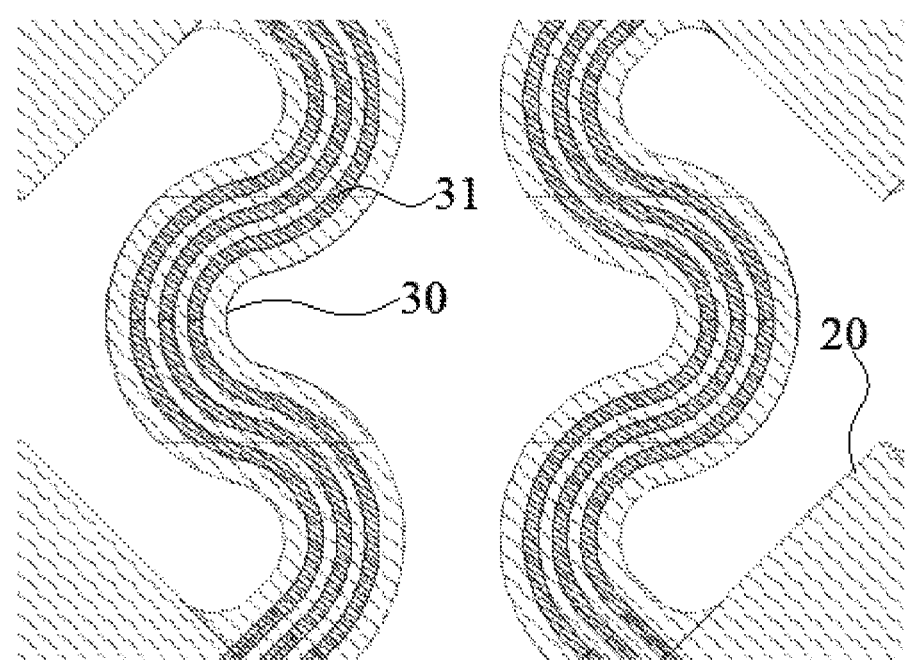
FIG. 7 is a schematic diagram of signal lines in hinge areas of a stretchable display panel of an embodiment of the present disclosure.

As shown in FIG. 7, which is a schematic diagram of signal lines in hinge areas of a stretchable display panel of an embodiment of the present disclosure. The wiring portions 30 are connected to a plurality of the display units 20 and are disposed in the hinge areas. Each of the wiring portion 30 includes the first type of signal line 31 disposed in the lower layer. The first type of signal line 31 in the first hinge area 121 includes the first scan line Sn, the second scan line Sn−1, and the light emitting control line EM. The first type of signal line 31 in the second hinge area 122 includes the red sub-pixel data line dataR, the green sub-pixel data line dataG, and the blue sub-pixel data line dataB.

For the specific implementation of the above operations, reference may be made to the previous embodiments, which will not be repeated here.

In summary, the stretchable display panel of the embodiments of the present disclosure makes the number of second power lines in the hinge areas extending along the second direction less than that of the second power lines in the hinge areas extending along the first direction. This effectively reduces the number of lines and line width of the hinge areas, and further increases stretchable performance of the display panel. Moreover, it ensures that a voltage drop in the display panel is reduced, and further makes the stretchable display panel to display uniform.

It can be understood that for those of ordinary skill in the art, equivalent replacements or changes can be made according to the technical solutions of the present disclosure and its inventive concept, and all these replacements or changes shall fall within the protection scope of the appended claims of the present disclosure.

What is claimed is:

1. A stretchable display panel, comprising:
a stretchable substrate comprising a plurality of island-shaped areas which are separated from each other and a plurality of hinge areas connecting the plurality of island-shaped areas, wherein each of the hinge areas comprises a first hinge area extending in a first direction (D1) and a second hinge area extending in a second direction (D2);
a plurality of display units correspondingly disposed in the island-shaped areas; and
a plurality of wiring portions connecting the plurality of display units and disposed in the hinge areas, wherein each of the wiring portions comprises at least one first power line and second power lines, the first power line is arranged in the second hinge area, and the second power lines are arranged in the first hinge area and the second hinge area,
wherein each of the wiring portions further comprises scan lines and a data line, the scan lines are disposed in the first hinge area, the scan lines comprise a first scan line (Sn), a second scan line (Sn−1), and a light emitting control line (EM), and the first scan line (Sn), the second scan line (Sn−1), and the light emitting control line (EM) are arranged parallel to each other along the first direction (D1);
wherein the data line is disposed in the second hinge area, the data line comprises one of a red sub-pixel data line (dataR), a green sub-pixel data line (dataG), and a blue sub-pixel data line (dataB), and the red sub -pixel data line (dataR), the green sub-pixel data line (dataG), and the blue sub-pixel data line (dataB) are arranged parallel to each other along the second direction (D2); and
wherein a number of the second power lines disposed in the second hinge area is less than a number of the second power lines disposed in the first hinge area;
wherein the first power line comprises an initialization power line (Vin), the second power lines comprise a driving power line (VDD) and a common power source line (VSS), and both the driving power line (VDD) and the common power source line (VSS) are formed with a metal grid pattern;
wherein the metal grid pattern comprises a first branch line arranged along the first direction (D1) and a second branch line arranged along the second direction (D2), and two adjacent first branch lines are arranged parallel to each other; a plurality of second branch arrays are also electrically connected between the two adjacent first branch lines, each of the second branch arrays comprises a pair of second branch lines arranged in parallel with each other, the second branch arrays are arranged in columns along the second direction (D2) at intervals, and the interval is in a unit of one second branch array, and the second branch arrays of two adjacent columns are staggered along the second direction (D2) and are arranged at the interval in the unit of one second branch array.

2. The stretchable display panel as claimed in claim 1, wherein the second branch arrays in the metal grid pattern formed by the driving power line (VDD) and the second branch arrays in the metal grid pattern formed by the common power source line (VSS) are staggered along the second direction (D2).

3. The stretchable display panel as claimed in claim 1, wherein each of the display units comprises a plurality of thin film transistors, a storage capacitor, and an organic light emitting diode.

4. The stretchable display panel as claimed in claim 3, wherein each of the display units further comprises a buffer layer, an active layer, a first gate insulating layer, a first gate metal layer, a second gate insulating layer, a second gate metal layer, an interlayer insulating layer, a first source/drain wiring layer, a first planarization layer, a second source/drain wiring layer, a second planarization layer, an anode metal layer, and a pixel definition layer which are sequentially disposed on the stretchable substrate.

5. The stretchable display panel as claimed in claim 4, wherein the second source/drain wiring layer in the first hinge area comprises the driving power line (VDD) and the common power source line (VSS); the second source/drain wiring layer in the second hinge area comprises the driving power line (VDD) and the initialization power line (Vin) along a third direction (D3), and the second source/drain wiring layer in the second hinge area comprises the common power source line (VSS) and the initialization power line (Vin) along the second direction (D2); and the third direction (D3) is opposite to the second direction (D2).

6. The stretchable display panel as claimed in claim 5, wherein the first source/drain wiring layer in the first hinge area comprises the first scan line (Sn), the second scan line (Sn−1), and the light emitting control line (EM); and the first source/drain wiring layer in the second hinge area comprises the red sub-pixel data line (dataR), the green sub-pixel data line (dataG), and the blue sub-pixel data line (dataB).

7. The stretchable display panel as claimed in claim 5, wherein a line width of a first type of signal line of the wiring portion in the first source/drain wiring layer ranges from 2 μm to 4 μm, a distance between two adjacent first type of signal lines ranges from 2 μm to 4 μm, and a boundary distance between the first type of signal line located at an outermost edge and the hinge area ranges from 4 μm to 6 μm; a line width of a second type of signal line of the wiring portion in the second source/drain wiring layer ranges from 4 μm to 6 μm, a distance between two adjacent second type of signal lines ranges from 4 μm to 6 μm, and a boundary distance between the second type of signal line located at an outermost edge and the hinge area ranges from 4 μm to 6 μm.

8. The stretchable display panel as claimed in claim 4, wherein the first source/drain wiring layer and the second source/drain wiring layer are made of Ti/Al/Ti alloy.

9. A stretchable display panel, comprising:
a stretchable substrate comprising a plurality of island-shaped areas which are separated from each other and a plurality of hinge areas connecting the plurality of island-shaped areas, wherein each of the hinge areas comprises a first hinge area extending in a first direction (D1) and a second hinge area extending in a second direction (D2);
a plurality of display units correspondingly disposed in the island-shaped areas; and
a plurality of wiring portions connecting the plurality of display units and disposed in the hinge areas, wherein each of the wiring portions comprises at least one first power line and second power lines, the first power line is arranged in the second hinge area, and the second power lines are arranged in the first hinge area and the second hinge area,
wherein a number of the second power lines disposed in the second hinge area is less than a number of the second power lines disposed in the first hinge area;
wherein the first power line comprises an initialization power line (Vin), the second power lines comprise a driving power line (VDD) and a common power source line (VSS), and both the driving power line (VDD) and the common power source line (VSS) are formed with a metal grid pattern;
wherein the metal grid pattern comprises a first branch line arranged along the first direction (D1) and a second branch line arranged along the second direction (D2), and two adjacent first branch lines are arranged parallel to each other; a plurality of second branch arrays are also electrically connected between the two adjacent first branch lines, each of the second branch arrays comprises a pair of second branch lines arranged in parallel with each other, the second branch arrays are arranged in columns along the second direction (D2) at intervals, and the interval is in a unit of one second branch array, and the second branch arrays of two adjacent columns are staggered along the second direction (D2) and are arranged at the interval in the unit of one second branch array.

10. The stretchable display panel as claimed in claim 9, wherein the second branch arrays in the metal grid pattern formed by the driving power line (VDD) and the second branch arrays in the metal grid pattern formed by the common power source line (VSS) are staggered along the second direction (D2).

11. The stretchable display panel as claimed in claim 9, wherein each of the display units comprises a plurality of thin film transistors, a storage capacitor, and an organic light emitting diode.

12. The stretchable display panel as claimed in claim 11, wherein each of the display units further comprises a buffer layer, an active layer, a first gate insulating layer, a first gate metal layer, a second gate insulating layer, a second gate metal layer, an interlayer insulating layer, a first source/drain wiring layer, a first planarization layer, a second source/drain wiring layer, a second planarization layer, an anode metal layer, and a pixel definition layer which are sequentially disposed on the stretchable substrate.

13. The stretchable display panel as claimed in claim 12, wherein the second source/drain wiring layer in the first hinge area comprises the driving power line (VDD) and the common power source line (VSS); the second source/drain wiring layer in the second hinge area comprises the driving power line (VDD) and the initialization power line (Vin) along a third direction (D3), and the second source/drain wiring layer in the second hinge area comprises the common power source line (VSS) and the initialization power line (Vin) along the second direction (D2); and the third direction (D3) is opposite to the second direction (D2).

14. The stretchable display panel as claimed in claim 13, wherein a line width of a first type of signal line of the wiring portion in the first source/drain wiring layer ranges from 2 μm to 4 μm, a distance between two adjacent first type of signal lines ranges from 2 μm to 4 μm, and a boundary distance between the first type of signal line located at an outermost edge and the hinge area ranges from 4 μm to 6 μm; a line width of a second type of signal line of the wiring portion in the second source/drain wiring layer ranges from 4 μm to 6 μm, a distance between two adjacent second type of signal lines ranges from 4 μm to 6 μm, and a boundary distance between the second type of signal line located at an outermost edge and the hinge area ranges from 4 μm to 6 μm.

15. The stretchable display panel as claimed in claim 12, wherein the first source/drain wiring layer and the second source/drain wiring layer are made of Ti/Al/Ti alloy.

16. A stretchable display panel, comprising:
a stretchable substrate comprising a plurality of island-shaped areas which are separated from each other and a plurality of hinge areas connecting the plurality of island-shaped areas, wherein each of the hinge areas comprises a first hinge area extending in a first direction (D1) and a second hinge area extending in a second direction (D2);

a plurality of display units correspondingly disposed in the island-shaped areas; and a plurality of wiring portions connecting the plurality of display units and disposed in the hinge areas, wherein each of the wiring portions comprises at least one first power line and second power lines, the first power line is arranged in the second hinge area, and the second power lines are arranged in the first hinge area and the second hinge area, wherein a number of the second power lines disposed in the second hinge area is less than a number of the second power lines disposed in the first hinge area;

wherein each of the display units further comprises a buffer layer, an active layer, a first gate insulating layer, a first gate metal layer, a second gate insulating layer, a second gate metal layer, an interlayer insulating layer, a first source/drain wiring layer, a first planarization layer, a second source/drain wiring layer, a second planarization layer, an anode metal layer, and a pixel definition layer which are sequentially disposed on the stretchable substrate;

wherein the second source/drain wiring layer in the first hinge area comprises the driving power line (VDD) and the common power source line (VSS); the second source/drain wiring layer in the second hinge area comprises the driving power line (VDD) and the initialization power line (Vin) along a third direction (D3), and the second source/drain wiring layer in the second hinge area comprises the common power source line (VSS) and the initialization power line (Vin) along the second direction (D2); and the third direction (D3) is opposite to the second direction (D2).

17. The stretchable display panel as claimed in claim 16, wherein a line width of a first type of signal line of the wiring portion in the first source/drain wiring layer ranges from 2 μm to 4 μm, a distance between two adjacent first type of signal lines ranges from 2 μm to 4 μm, and a boundary distance between the first type of signal line located at an outermost edge and the hinge area ranges from 4 μm to 6 μm; a line width of a second type of signal line of the wiring portion in the second source/drain wiring layer ranges from 4 μm to 6 μm, a distance between two adjacent second type of signal lines ranges from 4 μm to 6 μm, and a boundary distance between the second type of signal line located at an outermost edge and the hinge area ranges from 4 μm to 6 μm.

* * * * *